United States Patent [19]

Drogin

[11] 4,424,482
[45] Jan. 3, 1984

[54] ADAPTIVE BANDWIDTH SIGNAL ENCODER

[75] Inventor: Edwin M. Drogin, Dix Hills, N.Y.

[73] Assignee: Eaton Corporation, Cleveland, Ohio

[21] Appl. No.: 302,194

[22] Filed: Sep. 14, 1981

[51] Int. Cl.³ .............................................. G01R 23/14
[52] U.S. Cl. .................................. 324/79 D; 324/77 B
[58] Field of Search .................. 324/77 R, 77 B, 77 C, 324/77 CS, 78 D, 79 D; 364/484, 485

[56] References Cited

U.S. PATENT DOCUMENTS 3,745,317  7/1973  Berthier ........................... 324/77 B
3,821,482  6/1974  Hirsch ............................... 324/77 B
3,851,162  11/1974 Munoz ............................... 324/77 B
3,973,112  8/1976  Sloane ............................... 324/77 B

*Primary Examiner*—Michael J. Tokar
*Attorney, Agent, or Firm*—Kevin Redmond

[57] ABSTRACT

Apparatus and method for digitally encoding the frequency and pulse width of a pulse RF signal whereby the pulse is divided into a series of contiguous sampling periods within which the RF frequency is measured and recorded. The pulse width and frequency characteristics including FM and chirp content are encoded using a minimum number of digital bits.

7 Claims, 11 Drawing Figures

ADAPTIVE BANDWIDTH SIGNAL ENCODER

BACKGROUND

1. Field

The present invention relates to means for digitally encoding RF signals and, more particularly, to the encoding of pulsed high frequency RF signals using a minimum number of bits.

2. Prior Art

A well known digital technique for measuring the average frequency of a continuous RF signal is to count the number of times in a fixed time interval the voltage as a function of time passes through a fixed voltage value in one direction. For example, if the fixed time interval is one-second, the resultant count will give the number of cycles per second with a maximum error of plus and minus one cycle, if the measurement interval is arbitrary with respect to the phase of the periodic wave form, and the effect of noise is ignored.

FIGS. 1A and 1B aid in illustrating the theory of operation of this prior art frequency measurement system. FIG. 1A is a graph of a sine wave 105 plotted on a coordinate system in which the ordinate 101 represents amplitude and the abscissa 102 represents time. FIG. 1B is a square wave representation 106 of a long sampling period extending over many RF cycles plotted on a coordinate system in which the ordinate 103 represents amplitude and the abscissa 104 represents time. During the sampling period, the number of RF cycles present are counted, typically by a digital divider and counter containing flip-flop circuits. The frequency range of such devices are limited only by the speed at which the counting circuits at the input stage are able to operate.

By means of a mixing circuit, the operation range of the counting device can be placed anywhere in the spectrum, as for example, a 2 GHz range between 10 to 12 GHz may be transferred to 0 to 2 GHz, lowering the required speed of the first flip-flop circuit.

If only a single RF pulse is available, the measurement period cannot be arbitrary, but must obviously be equal to or less than the available pulse width. Commonly used frequently meters designed to operate on CW signals have long sampling time. When such devices are used with pulsed RF signals, a number of pulses and interpulse periods containing no signal are included in a single sampling period. The results of the use of such meters with a pulsed signal is a count of the number of cycles within all the pulses encompassed in the sampling period, divided by the total sampling period time, including the interpulse periods, providing an entirely erroneous measurement of the frequency. The reason for this error is shown in FIG. 2. This Figure illustrates a pulsed signal with pulses 203 and 205 containing RF signals 204 and 206 respectively, an interpulse period 207 and a long sampling period 106 plotted on a coordinate axis in which the ordinate 201 represents amplitude and the abscissa 202 represents time. The two pulses 203 and 205 as well as the interpulse period are encompassed by the sampling period 106. A typical prior art counting circuit counts through the pulses but also includes the interpulse period 207 as a part of the total sampling period, and as a result produces an output that is only an average frequency which is much lower than the actual frequency within the pulses.

In the example shown in FIG. 2, the cause of the error is the sampling period which is much longer than a pulse width, but even where the sampling period is made equal to the pulse width, the measurement may be erroneous because the signal within the pulse may be frequency modulated. The result of measuring a frequency modulated pulse with the prior art system described above would again be an average, rather than an indication of the frequency modulation content of the pulse. This problem is illustrated in FIG. 3 where a pulse 303 containing a frequency modulated signal 304 is plotted on a coordinate axis in which the ordinate 301 represents amplitude and the abscissa 302 represents time. The sampling period 305 encompasses only the pulse 303. A conventional counting circuit would only count the number of cycles and divide by the pulse width to produce an average frequency without taking note of the frequency modulation.

A second prior art technique eliminates most of the problems associated with the first technique described above, but adds a number of additional problems of its own. In this second prior art technique the signal is first limited and then sampled by means of a clock operating at a frequency fc. Samples are taken at a rate equal to or greater than the RF bandwidth. In accordance with the Nyquist criterion, a range of frequency from a low end frequency, $f_l$ to a high end frequency $f_h$ can be unambiguously encoded, if fc is equal to two times $f_h - f_l$, which is twice the RF bandwidth. This sampling technique can encode RF signals with carrier bandwidths equal to or less than $f_h - f_l$, but is very wasteful for the majority of signals with more modest bandwidths.

This is illustrated in FIG. 4A and 4B. FIG. 4A is a graph of a signal 408, shown after the limiting process on a coordinate axis in which the ordinate 403 representing amplitude and an abscissa 404 representing time. Sampling points 409 are taken for each positive and negative swing of the signal. This is an optimum sampling rate for this signal, for it requires the minimum number of bits to record frequency. However, FIG. 4B shows a signal 410 with a lower frequency and a much less optimum sampling rate. Many more sampling points 411 are used during the positive and negative signal swings, making the number of bits used for representation higher than the minimum and therefore wasteful of digital storage used to record such a signal.

SUMMARY

It is an object of the present invention to provide a means of digitally encoding and storing RF pulse signals using a minimum number of bits.

It is an object of the present invention to measure pulse width and pulse frequency simultaneously.

The present invention comprises a threshold detector for determining the presence of a pulse, a sampling circuit for dividing the pulse into a number of sampling periods, a high speed frequency counter and a digital storage unit. The threshold detector initiates the sampling operation to divide the pulse into a number of contiguous sampling periods. The division is terminated by the threshold detector when a pulse falls below the threshold level. The cycles of the RF signal within each contiguous sampling period are counted by the high speed frequency counter and the output of the counter is stored in the digital storage unit along with an identification of the particular sampling period in which the count was made.

The apparatus further comprises a pulse width counter which counts the number of sampling periods required to cover the complete pulse. The output of the pulse width counter is also stored in the digital storage unit to provide a record of pulse width. The count of the number of sampling periods and a knowledge of the time duration of each sampling period provides the required information to determine width. The frequency count of each sampling period and the identification of the sampling period determines the entire frequency within the pulse, including a measurement of the presence of FM or chirp. Therefore the data stored by the present invention is capable of reproducing pulse width, pulse frequency and pulse frequency modulation content.

DETAILED DESCRIPTION OF THE INVENTION

Figure 1A:
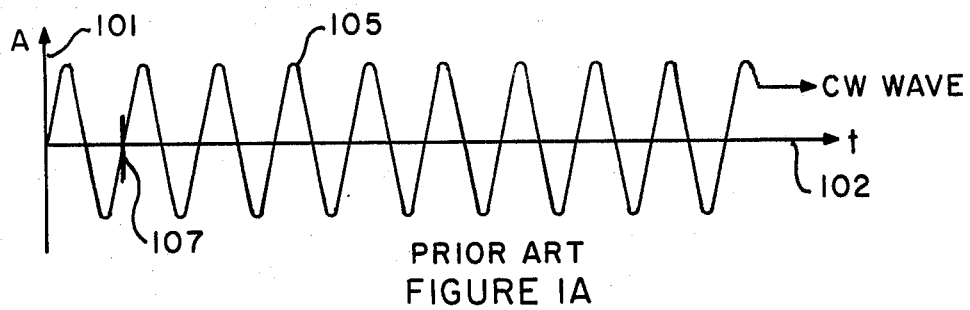
FIG. 1A is a graph of a continuous wave signal.
Figure 1B:
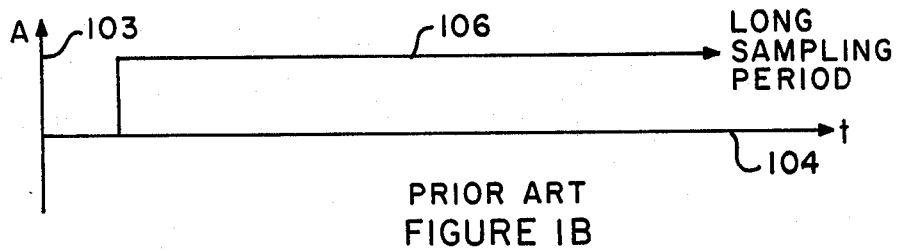
FIG. 1B is a graph of a long sampling period used to measure the frequency of the continuous wave shown in FIG. 1A.
Figure 2:
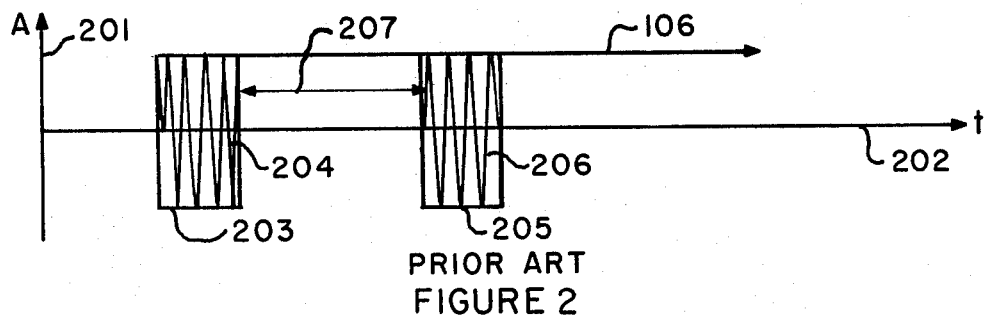
FIG. 2 is a graph of repetitive pulses and the use of a long sampling period to measure the frequency of these pulses.
Figure 3:
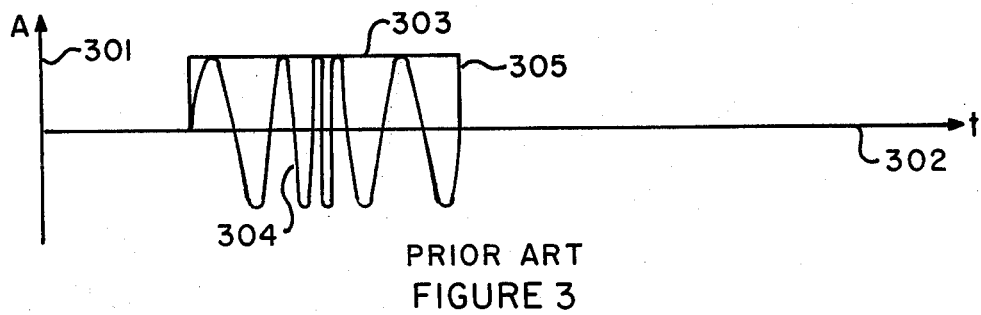
FIG. 3 is a graph of a pulse containing a frequency modulated signal.
Figure 4A:
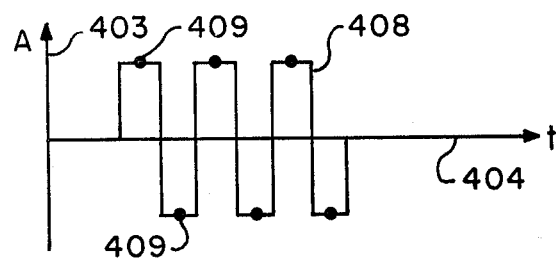
FIG. 4A is a graph of a signal which has been limited and is sampled at the rate of once per half cycle.
Figure 4B:
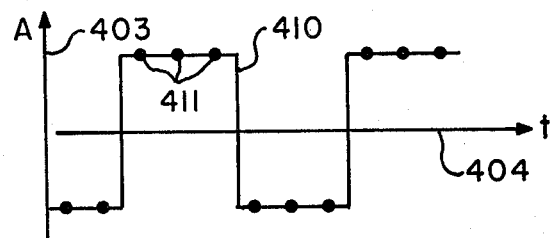
FIG. 4B is a graph of a signal which has been limited and sampled at the rate of three times per half cycle.
Figure 5:
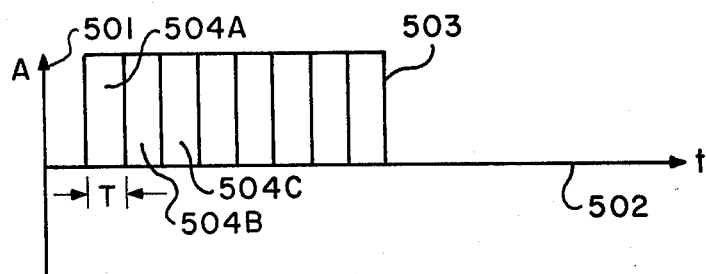
FIG. 5 is a graph of a pulse sampled by eight contiguous sampling periods extending throughout the pulse duration.

Referring to FIG. 5, a graph of pulse 503 is shown divided into eight contiguous sampling periods of uniform width T, as exemplified by the sampling periods designated 504A, B, and C. In this Figure, the pulse 503 is graphed on a coordinate system in which the ordinate 501 represents amplitude and the abscissa 502 represents time. This graph generally represents the sampling method used in the present invention, wherein a pulse is divided into a number of contiguous sampling periods. The number of RF cycles within each sampling period is measured and recorded with an identification of the particular sampling period in which the frequency measurement was made. This system has only one frequency output to be encoded and stored for a sampling period of length T, whereas in prior art systems, such as the one illustrated in FIG. 4, many samples may be taken for each half cycle and a corresponding high number of data bits may be required to store the information for each cycle. Frequency modulation (FM) within the pulse is also automatically accommodated by the present invention without any special circuitry because the different frequencies present in each sampling period when FM is used, are detected and recorded to provide an accurate record of the FM content.

Figure 6:
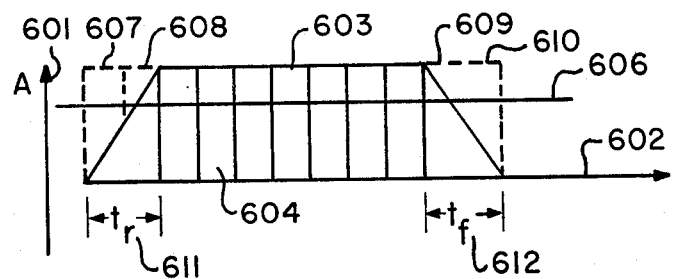
FIG. 6 is a graph of a pulse divided by 10 contiguous sampling periods extending through the pulse rise, on, and fall times.

The system of the present invention also permits the measurement of pulse width. To accomplish this, the sampling periods are not initiated until a threshold has been exceeded by the pulse to be measured. The pulse continues to be sampled until the threshold is again passed in the opposite direction. By counting the number of sampling periods present throughout the duration of the pulse, the pulse width is determined. This approach to measuring pulse width is illustrated in FIG. 6, where a pulse 603 is plotted on a coordinate axis in which the ordinate 601 represents amplitude and the abscissa 602 represents time. The pulse has a rise time 611 and a fall time 612. If the entire pulse were divided into contiguous sample periods, there would be two sampling periods, 607 and 608, during the rise time and two sampling periods 609 and 610 during fall time. The frequency within a pulse during the rise and fall time is affected by the rise and fall time transients as well as by noise. The erroneous data measured during these transients can be deleted by a threshold or a peak detector which permits operation only when a set level or a peak level, such as level 606, is reached, thereby deleting data taken during periods 607 through 610. For convenience, threshold detection and peak detection will both be considered as pulse detection operations and a device referred to herein as a pulse detector will be considered as carrying out either or both of these functions. The level at which threshold or peak detection is carried out will be referred to herein as the pulse detection level.

Figure 7:
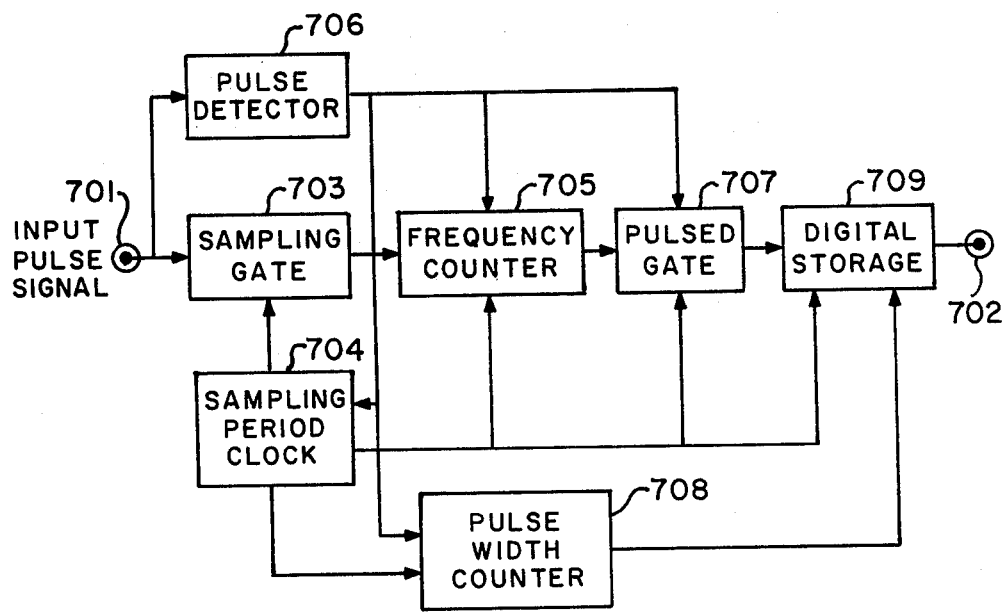
FIG. 7 is a system block diagram of the present invention designed to accurately encode the RF frequency within a pulse as well as the pulse width, using a minimum number of digital bits.

FIG. 7 is a block diagram of a system made in accordance with the present invention for the measurement of intrapulse frequency and pulse width. This system comprises input port 701, output port 702, sampling gate 703, sampling period clock 704, digital counter 705, pulse detector 706, pulse gate 707, pulse width counter 708, and digital storage unit 709.

In the operation of this system, a pulse modulated RF signal is supplied to input port 701 where it is passed through the sampling gate 703 to the digital counter 705. The sampling gate is open and closed in accordance with sampling period clock 704. The digital counter first counts the number of cycles within each sampling period admitted to it through the sampling gate and is then reset at the end of each counting period by the sampling clock. Where very high speed counting is involved, the counter is permitted to run continually with a reading being taken at the end of each sampling period. The count within a sampling period is determined by subtracting the reading at the beginning of the period from that at the end. The output of the digital counter, indicating the total number of cycles of RF signal within each sampling period, is fed through the pulse gate to the digital storage unit which records the identification number of a particular sampling period and the associated output of the digital counter for that period. The pulse detector accepts the input pulse from the input port to initiate a count by the digital counter and to open the pulse gate to pass the counter output signal to the digital storage unit only when the pulse level exceeds a preset threshold level or reaches its peak level. The pulse detector thereby prevents the rise and fall time counts from being entered into the digital storage unit.

The pulse width counter is also initiated by the pulse detector and receives a series of pulses from the sampling period clock representing the number of sampling periods occurring throughout the duration of the pulse. The output of the pulse width counter is supplied to the digital storage unit to record data from which the pulse width may be determined. The frequency within each sampling period and the pulse width data may be read out from the digital storage unit through output port 702.

Counting circuits, which are essential to the present invention, can operate at higher frequencies, with a given digital technology, than most other logic circuitry. For example, flip-flop dividers using gallium arsenide devices operating at 4 GHz have been reported. Using shift register counters, such as the Johnson counter, shown in FIG. 8, n flip-flops can be employed to count to "2n", with all flip-flop stages operating at 1/2n times the input frequency, where n is any integer other than zero. Such circuits, implemented with gallium arsenide devices, should permit counting at well over 8 GHz. Sampling of the counter states can easily be accomplished at better than 100 MHz rates with current technology, permitting frequency ranges of over 4 GHz and intrapulse bandwidths of over 50 MHz to be accommodated.

Figure 8:
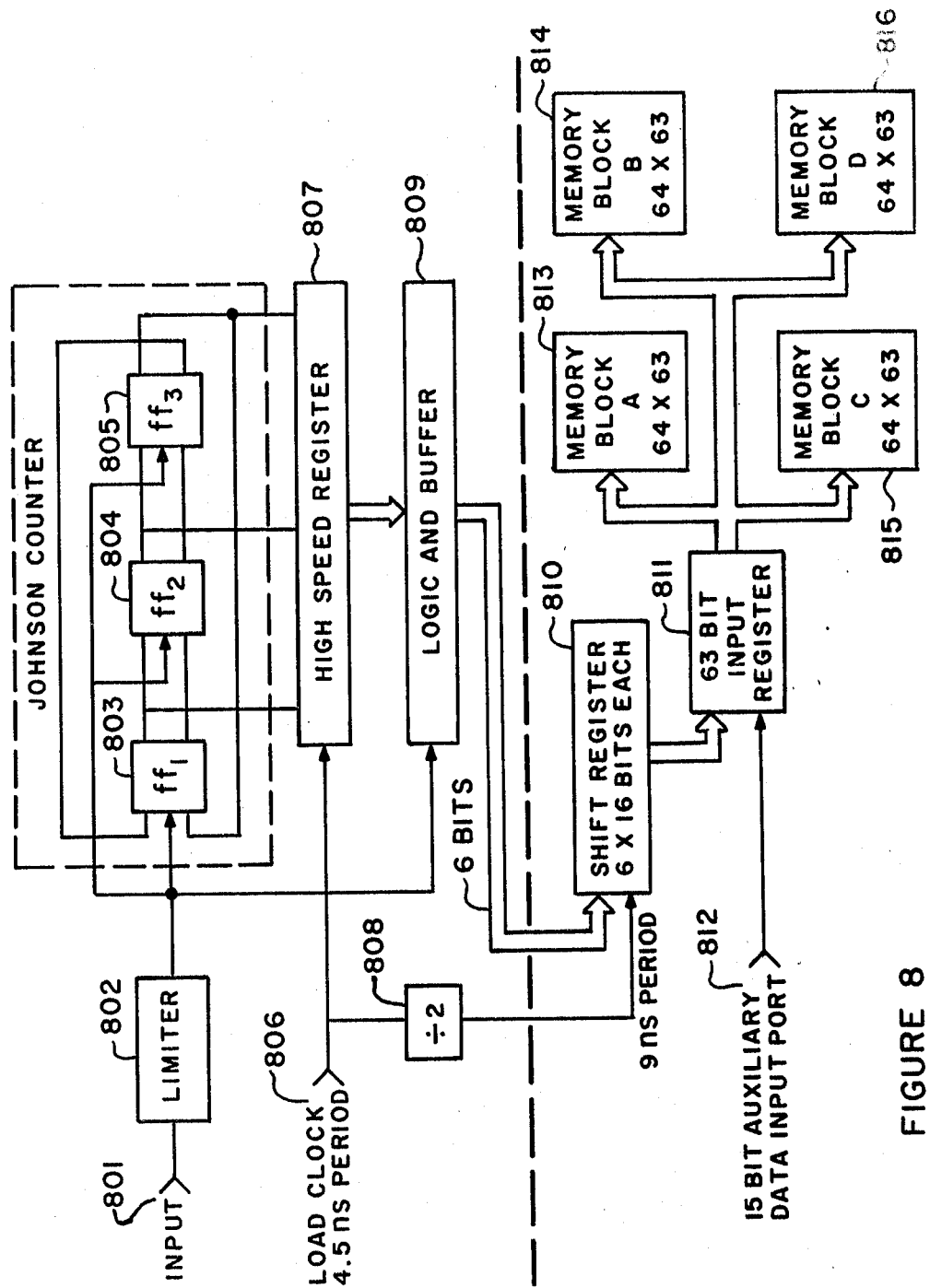
FIG. 8 is a system block diagram of a high speed counter for use with the present invention.

FIG. 8 is a detailed block diagram of a high speed frequency counter and storage unit suitable for use in the present invention. This Figure is divided into an upper and lower portion by a horizontal dashed line. The upper portion represents circuitry which is feasible, but has not been tested as yet, while the lower portion represents circuitry which has been fabricated and successfully tested. The upper portion is comprised of an input port 801, a limiter 802, first, second and third high-speed flip-flops, ff$_1$ through ff$_3$ designated by drawing numerals 803 through 805, respectively, a load clock input port 806, a 6 bit high-speed register 807, a divide-by-two circuit 808, and a logic and buffer circuit 809.

The lower portion of the circuitry comprises a 96 bit shift register 810, a 63 bit input register 811, an auxiliary data input port 812, and memory blocks A through D, designated by drawing numerals 813 through 816, respectively.

The pulsed RF input signal to be measured in order to determine RF frequency is applied to the input port 801 and passed through the limiter to the three high-speed flip-flops 803 through 805, which are connected in series with appropriate feedback circuits to form a Johnson counter for dividing the input signal frequency by six. The output of the Johnson counter is fed through the register 807, the logic and buffer circuit 809, the 96 bit shift register 810 and the 63 bit input register 811, before being delivered to the memory blocks 813 to 816.

In the operation of this system, an input pulse is first divided into a number of sampling periods and then the RF cycles within each sampling period are counted and stored. The high-speed stream of serially supplied bits is converted to a slower streams of parallel bits which can be stored by slower, conventional digital storage means. To accomplish these tasks, the pulsed RF input signal is first limited in limiter 802 and then divided by six in the Johnson counter. The high-speed register accepts the count from the counter at some fast periodic rate which will divide the pulsed RF input signal into a number of periods.

FIG. 8 shows a load clock supplying port 806 with a signal which will provide, for example, a 4.5 ns sampling period. This example provides an approximately 100 MHz intrapulse bandwidth and an $f_h$ of up to 6 cycles in 4.5 ns, or over 1 GHz. The clock signal at port 806 is supplied to the high-speed register 807 as well as to the divide-by-two circuit 808. The high-speed register must be capable of quickly accepting the data from the Johnson counter at the instant it receives the clock signal. The logic and buffer circuit, on the other hand, has the entire 4.5 ns period to withdraw the data from the high-speed register.

The logic and buffer circuit also receives the limited input signal from the limiter to permit it to determine if a change in the output of the high-speed register is expected because of the imminent receipt of another bit. If such a bit is about to be received, the logic and buffer circuit waits until the bit has been received before reading the data from the high-speed register.

The 96 bit shift register receives the slower rate data from the logic and buffer circuitry and therefore operates with a lower speed clock input provided by the divide-by-two circuit 808. The output rate from the 96 bit register is substantially slower than that produced by the logic and buffer circuit. This slower output stream of data relating to the pulse frequency, along with the input data provided at the auxiliary input port 812, is accepted by the 63 bit input register 811. The auxiliary data is intended to include such information as pulse width, input phase and flags. It can be seen from this description that the high-speed counter and storage unit of FIG. 8 may be used to supply the functions of the frequency counter 705 and digital storage unit 709 shown in FIG. 7.

In general, in the present invention, the sampling period is determined by a precision clock oscillator of frequency $f_s$. The period of the measurement T must therefore be an integral number of clock periods. If fd is the frequency after down conversion of an unknown input and T is many clock periods, the maximum error, assuming the cycle count is correct and T cannot be in error by more than one clock period, $1/f_s$, is less than $f_d/f_s T$ when $f_s > f_d$. On the other hand, when $f_d > f_s$, the error will be less than $\pm 1/2T$, since now the source of error is the number of cycles counted within the precision interval T, which can be in error by $\pm \frac{1}{2}$ cycle.

Many RF signal pulses of interest have close to unity time-bandwidth product. For example, a one microsecond pulse having a fixed RF carrier can be optimally detected in a receiver having an IF bandwidth of 2 MHz and a detector bandwidth of 1 MHz, which is said to be matched to the input pulse. That is, the IF bandwidth is equal to 2/P where P is the pulse width and the detected bandwidth is equal to 1/P. Obviously if $T \simeq P$ the error will always be less than $\pm 1/2T$ so a reproduced encoded pulse would fall within the receiver acceptance bandwidth and be detected as was the original pulse. Thus, the frequency measurement technique herein described is adequate for encoding RF pulse signals of unity time bandwidth product.

The following example illustrates one advantage of the present invention over the type of prior art system illustrated in FIG. 5, referred to herein as the one bit quantizing technique. Unfortunately, many bits may be required to encode a sample RF cycle with the one bit system. In accordance with the Nyquist Criteria, a range of frequencies from $f_l$ to $f_h$ can be unambiguously encoded if $fc \geq 2 (f_h - f_l)$ where $f_h$ is the highest frequency in the bandwidth under consideration and $f_l$ is the lowest. Such a technique can be used to encode RF pulse signals where the carrier bandwidth is equal to $f_h - f_l$, but is very wasteful for the majority of signals with much more modest time bandwith products. For example, a clock frequency of 1 GHz will accommodate both a frequency range and a carrier bandwidth of 500 MHz, but will require storage of an encoded output of 1000 bits per microsecond of pulse width. This is in contrast to the frequency measurement system of the present invention which can encode the same information for a fixed frequency carrier by way of a 9 bit word, specifying the number of cycles in a microsecond of say 0 to 500, for example, and another 10 bit word specifying the number of clock periods in the measurement period, say 0 to 1000, for a total of 19 bits in contrast to the 1000 bits required with the one bit quantizing technique of FIG. 5. The one bit quantizing technique does have an advantage in that simple circuitry may be used to decode and reproduce the encoded pulse; however, this advantage is greatly overshadowed by the enormous digital storage requirements of this technique.

To improve the accuracy of the present invention, the number of "one-half cycles" of RF input can be counted, and within a given period, the fact that the first cycle starts with a positive or negative half cycle can be encoded by a separate "flag" bit or bits. It is possible to instantaneously decode such stored data to reproduce the encoded signal with high accuracy both in frequency and phase.

Another advantage of the present invention over the prior art is in the bit rate. In the one bit quantizing scheme, the use of data bits is highly inefficient because this technique provides for encoding RF pulses whose intrapulse bandwidth is equal to the total frequency coverage capability of the device. The present invention employs sampling of a frequency counter at the Nyquist rate wherein this rate is only as high as is necessary to accommodate to the intrapulse bandwidth of the RF carrier signal, which may be frequency modulated in some deliberate fashion, but never has an intrapulse bandwidth encompassing the entire RF spectrum of interest.

The bit rate of the encoder output for the 1 bit quantizer scheme is $\geq 2f_{dm}$ where $f_{dm}$ is the highest RF frequency or the highest down converted RF frequency that must be unambiguously encoded. For example, if $f_{dm}$ is 4 GHz, the bit rate will be 8 billion bits per second, and 8,000 bits will have to be stored to encode a pulse one microsecond wide. With the present invention, the bit rate required is only $(f_s) \log_2(kf_{dm}/f_s)$ where $f_s$ is the rate at which the cycle counter is sampled and $K=1$ or 2 depending on whether there is one count per cycle or 2 counts per cycle. Assuming $f_s=250$ MHz to accommodate intrapulse bandwidths of up to 125 MHz, the bit rate will be $250 \log_2 (8,000/250) = 1.25$ million bits per second at 2 counts/cycle of $f_{dm}$, or a requirement of only 1250 bits to be stored for a 1 microsecond pulse. At one count per cycle of $f_{dm}$ this reduces to only 1,000 bits to store a one microsecond pulse. An additional 14 bits are required to indicate starting phase and the measurement period to 1 part in 8,000, which is a $1/f_c$ resolution. If this is done, the accuracy of both techniques when encoding a low frequency, narrow bandwidth pulse, is identical, with the peak frequency error being less than $f_d/f_c T$.

In the example above, $f_c$ is assumed to be 8 GHz. If the period is not stored, the encoder of the present invention will have a peak error of $1/2T_p$ where $T_p$ is approximately the pulse width assuming two counts per cycle of $f_d$. As previously explained, this is adequate in many cases.

There are a number of equivalents and alternatives which fall within the spirit and scope of this invention. For example, an additional feature which may be incorporated in the invention is a separate analog to digital conversion of the detected envelope of the RF pulse. This can be performed at a rate commensurate with the bandwidth of the amplitude modulation of the RF carrier. With this addition, the invention allows separate encoding of the frequency and the amplitude modulation of the RF carrier. This is in contrast to the 1-bit quantizing scheme, wherein improvements in performance utilizing multi-bit analog to digital conversion, requires an increase in the bit rate to $2Kf_{dm}$ where K is the number of bits of the multi-bit conversion.

Any one-half or full cycle counting scheme may be employed for the encoder utilizing other than straight binary codes. The "Johnson Counter" is but one example. Conversion to binary, before storage, is desirable to minimize the number of bits in storage but is not essential. Storage of additional flag bits and a period measurement is also desirable, but not essential and has trivial impact on the total number of bits in storage for typical radar pulse widths.

The amount of storage can be reduced by noting that one of the basic principles of the present invention is that the sampling rate be commensurate with the intrapulse bandwidth requirements and that the number of bits per sampling period be related to the maximum average frequency of the unknown input RF signal in each sampling interval. This encoding technique is optimal in an information theory sense, in that it takes the minimum number of bits to describe an RF signal of arbitrary intrapulse bandwidth whose intrapulse bandwidth is less than the RF spectrum coverage required.

It is clear that the number of bits in storage, to represent an RF pulse of arbitrary intrapulse bandwidth, can be optimized by way of measurement of the actual encoder output. For example, assume the samples of the counter contents are immediately differenced prior to storage. A stream of numbers will result at rate $f_s$ representing the number of cycles of the input, $f_d$ occurring at each interval, $1/f_s$. If these numbers are compared before storage, no information will be lost if equal numbers that occur in contiguous sample intervals are summed before storage.

As an example, suppose a series of five bit numbers representing samples are all equal because the unknown input RF signal has a fixed carrier frequency. In this example, assume in using a 1 microsecond pulse width, there will thus be approximately 250, five bit numbers out of the encoder. If they are all summed, the result will be a maximum of a 13 bit number plus an additional 8 bit number defining the fact that a particular number of intervals, approximately 250 in this example, have been summed. Thus, for the fixed frequency case, the 1250 bit storage requirement is reduced to only 21 bits. In general the storage requirement will be between 21 and 1250 bits, with the latter being necessary only when the unknown signal has an intrapulse bandwidth approaching the maximum capability of say 125 MHz for this example. With this extension of the encoding scheme, the number of bits in storage can be automatically adjusted, where possible, to match the actual intrapulse bandwidth of the a-priori unknown RF signal.

Figure 9:
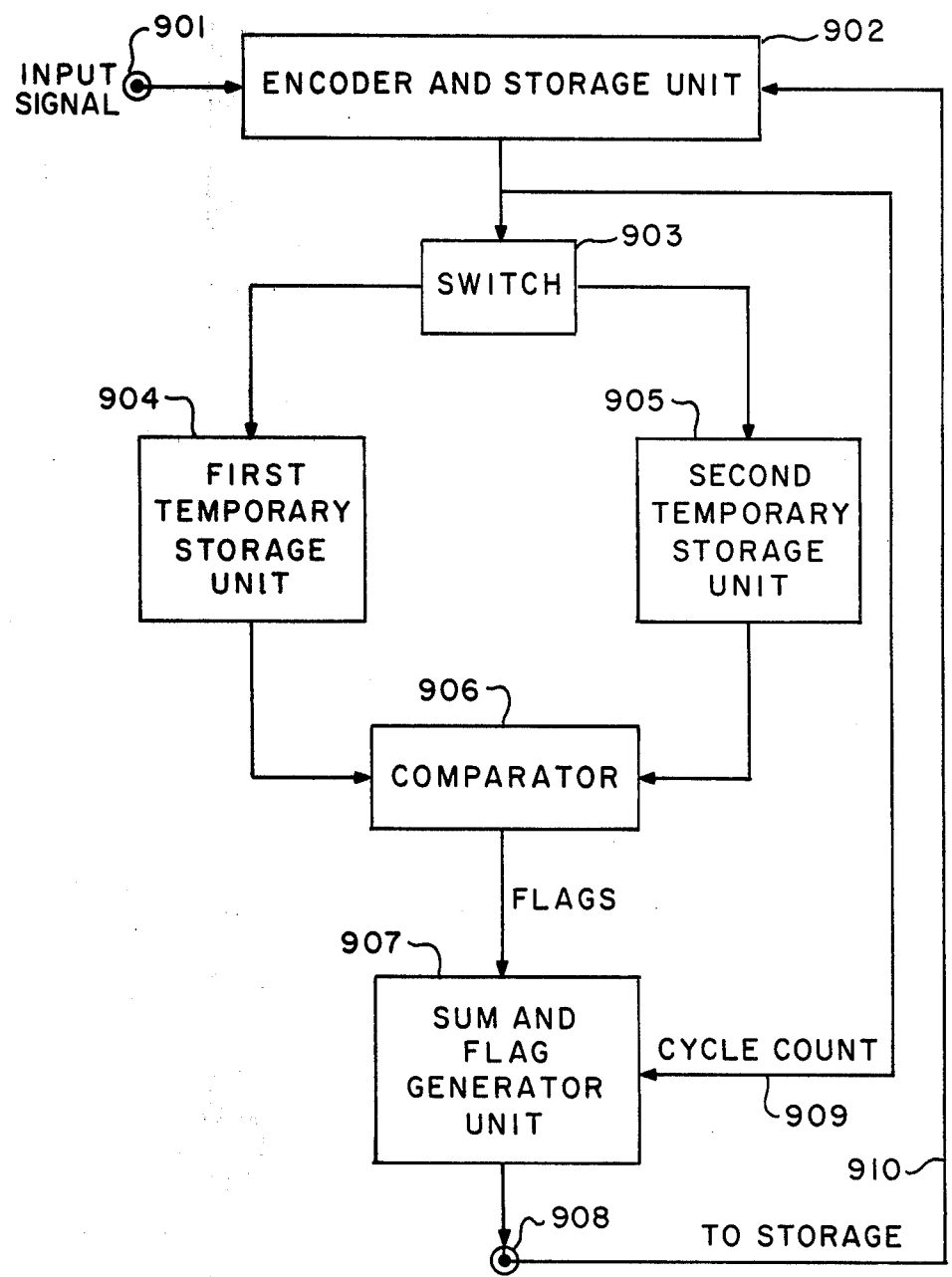
FIG. 9 is a block diagram of a subsystem designed to reduce the storage requirement for CW content within a pulse.

FIG. 9 is a subsystem block diagram illustrating the above described extension of the coding system. The components of this subsystem comprise an encoder and storage unit 902 with a signal input port 901, a high-speed switch 903, a first temporary storage 904, a second temporary storage 905, a comparator 906, and a sum and flag generating circuit 907, having a signal output port 908.

In the operation of this subsystem, the input pulse signal is received at the input port and supplied to the encoder which divides the pulse into a number of periods and counts the number of cycles in each period. The count of cycles in a period taken in the encoder is supplied to the switch 903 which alternatively supplies successive cycle counts to the first and second temporary storage units. The cycle counts stored in the first and secondary storage units are supplied to the comparator where they are compared. The output of the comparator is supplied to the sum and flag generating unit. Where the cycle count in the first and second storage units is identical, the counts are added in the sum and flag generating unit and supplied to the output port along with a flag signal indicating the number of counts so added. This data is then supplied from the output port 908 to the storage portion in the encoder and storage unit 902.

An alternate system approach to the above described subsystem processing is to simply record the count of cycles in a period and the number of times that this count repeats successively. This is accomplished in the subsystem shown in FIG. 9 by merely altering the function of the Sum and Flag Generating Unit 907 to count the number of flags indicating successive periods having the same number of cycles and to provide an output which indicates the number of cycles in such successive periods. The number of cycles in such periods may be taken from the encoder and storage unit and supplied to unit 907 by way of transmission line 909.

All the components required for the circuit of FIG. 9 including the switch, temporary storage, comparator and the sum and flag generating unit are commonly available and well known to those skilled in the art. Variations of this subsystem which incorporate the basic apparatus are considered as being within the scope of this invention. A very useful variation falling within this catagory is to permit flags to be generated by the comparator when the difference between the cycle count in the first and second storage unit differs by a fixed amount such as one or two cycles rather than limiting flag generation to exactly equal counts.

Having described my invention, I claim:

1. Apparatus for encoding a pulse signal, comprising:
   (a) means for dividing the pulse signal into a series of contiguous sampling periods, said means for dividing being connected to receive the pulse signal as an input and provide the divided pulse signal as an output,
   (b) means for counting the number of cycles within each sampling period, said means for counting the number of cycles being connected to receive the divided pulse from the means for dividing as an input and provide the count of cycles within each sampling period as an output, and
   (c) means for encoding and storing the number of cycles within each sampling period and identifying the particular sampling period for which the data is being stored, said means for encoding being connected to the means for counting the number of cycles to receive the count within each period.

2. Apparatus as claimed in claim 1, further comprising:
   (a) means for comparing the count of cycles in a present sampling period with the count in an immediately preceding period, said means for comparing being connected to the means for counting cycles to receive as an input the number of cycles in each of the sampling periods within a pulse and to provide as an output a flag indicating the presence of identical counts in the previous and present sampling periods,
   (b) means for counting the number of flags indicating successive periods which have the same count, said means for counting the number of flags being connected to receive the flags from the means for comparing,
   (c) means for transmitting from the means for counting the number of cycles to the means for storing, a single count of the cycles in one of the successive sampling periods which have the same count,
   (d) means for transmitting from the means for counting the number of flags to the means for encoding and storing, the number of flags and the single count in place of a plurality of individual counts for successive periods having the same count to reduce the required storage capacity necessary to record the presence of a constant frequency over a number of contiguous sampling periods.

3. Apparatus as claimed in claim 1, further comprising:
   (a) means for comparing the count of the number of cycles in a present sampling period with the count in an immediately preceding period, said means for comparing being connected to the means for counting cycles to receive as an input the number of cycles within a sampling period and to provide as an output a flag indicating the presence of identical counts in the present and previous sampling periods,
   (b) means for adding the total count of successive sampling periods in which there is an identical count, said means for adding the total count being connected to receive the number of cycles within a sampling period from the means for counting the number of cycles and to receive the flags indicating the number of successive periods having the same count from the means for comparing, the presence of the flags indicating the duration of time over which the counting of the total number of cycles continues,
   (c) means for transmitting the total count of cycles from the means for adding the total count to the means for encoding and storing, and
   (d) means for supplying the number of flags indicating the number of successive periods in which the same count is received to the means for encoding storage to provide data from which the total count may be converted to the constant frequency contained over a number of contiguous sampling periods.

4. Apparatus as claimed in claim 1, wherein the means for dividing the pulse also provides as an output a signal indicating the occurrance of sampling periods all of which are of known uniform duration, and the apparatus further comprises means for counting the number of sampling periods occurring during a pulse, said means for counting the number of sampling periods during a pulse being connected to receive as an input from the means for dividing a pulse, the signal indicating the occurrance of a sampling period, and said means for counting the number of sampling periods providing as an output the count of the uniform sampling periods during the pulse duration, thereby providing a measure of the pulse width.

5. Apparatus as claimed in claim 2, wherein the means for dividing the pulse into a number of sampling periods comprises a sampling period clock, a sampling gate placed in series between the source of the pulse signal and the means for counting cycles, and wherein the means for counting the number of pulses within the pulse period is a digital counter, the means for determining the pulse width is a pulse width counter connected to the sampling period clock, and the means for storing the pulse width and the frequency measured within each of the sampling periods is a digital storage unit connected to the sampling period clock, the pulse width counter and the output of the means for counting the number or cycles.

6. A method of encoding the frequency within an RF pulse signal comprising the steps of:
(a) dividing the pulse into contiguous sampling periods and identifying each sampling period,
(b) counting the cycles within each sample,
(c) storing the individual counts within each sampling period along with the identification of the particular sampling period in which the count is made,
(d) initiating the first sampling period when the pulse exceeds a pulse detection level, and
(e) terminating the sampling periods when the pulse falls below the pulse detection level.

7. A method as claimed in claim 6, further including the steps of:
(a) providing a means for counting the number of sampling periods within a pulse,
(b) encoding and storing the number of sampling periods within the pulse to store data from which the pulse width may be determined.

* * * * *